(12) United States Patent
Franke et al.

(10) Patent No.: US 8,493,078 B2
(45) Date of Patent: Jul. 23, 2013

(54) SENSOR FOR CAPACITIVE DETECTION OF A MECHANICAL DEFLECTION

(75) Inventors: Axel Franke, Ditzingen (DE); Alexander Buhmann, Stuttgart (DE); Marian Keck, Leonberg (DE)

(73) Assignee: Robert Bosch GmbH, Stuttgart (DE)

( * ) Notice: Subject to any disclaimer, the term of this patent is extended or adjusted under 35 U.S.C. 154(b) by 381 days.

(21) Appl. No.: 12/925,067

(22) Filed: Oct. 12, 2010

(65) Prior Publication Data

US 2011/0109327 A1    May 12, 2011

(30) Foreign Application Priority Data

Oct. 14, 2009    (DE) .................. 10 2009 045 696

(51) Int. Cl.
*G01R 27/26*    (2006.01)
(52) U.S. Cl.
USPC ............ 324/658; 324/660; 324/661; 324/679
(58) Field of Classification Search
USPC .................. 324/515, 519, 658–690
See application file for complete search history.

(56) References Cited

U.S. PATENT DOCUMENTS 5,824,565 A * 10/1998 Li et al. ........................ 438/48
7,810,394 B2 * 10/2010 Yazdi ........................ 73/514.18

FOREIGN PATENT DOCUMENTS

DE    102007033001 A1 *    1/2009

* cited by examiner

*Primary Examiner* — Huy Q Phan
*Assistant Examiner* — Dustin Dickinson
(74) *Attorney, Agent, or Firm* — Kenyon & Kenyon LLP

(57) ABSTRACT

A sensor for capacitive detection of a mechanical deflection includes a substrate having a first substrate electrode and a second substrate electrode; and a mass movable relative to the substrate. The mass is divided into: a first electrically separate region having a first ground electrode; and a second electrically separate region of the mass having a second ground electrode. At least one portion of the first ground electrode is situated in a first region between the first substrate electrode and the second substrate electrode, and forms a first differential capacitor. At least one portion of the second ground electrode is situated in a second region between the first substrate electrode and the second substrate electrode, and forms a second differential capacitor.

8 Claims, 2 Drawing Sheets

SENSOR FOR CAPACITIVE DETECTION OF A MECHANICAL DEFLECTION

BACKGROUND OF THE INVENTION

1. Field of the Invention

The present invention relates to a sensor for capacitive detection of a mechanical deflection, and a method for capacitive detection of a mechanical deflection.

2. Description of Related Art

Micromechanical sensors such as acceleration sensors, yaw rate sensors, or pressure sensors are frequently used. A conventional form of evaluation of such sensors is the capacitive evaluation in which a deflection induced by the variable to be measured is converted to a change in capacitance, which is then evaluated electrically. In the case of inertial sensors, this is usually accomplished via a differential capacitor which includes two stationary electrodes and a movable electrode situated therebetween. In the case of movement of the movable electrode, capacitances $C_1$ and $C_2$ change in opposite directions between the movable electrode and the two stationary electrodes. This change is usually evaluated as a so-called $\Delta C/C$ evaluation, the following equation applying for the output signal:

$$U_{out} = \frac{C_1 - C_2}{C_1 + C_2 + 2C_p} U_{ref}$$

So-called parasitic capacitances $C_p$ may include various contributions, depending on the partitioning concept and the type of sensor. Stray fields on the sensor structure, on the solder points (pads), and on the wires (bond wires) may contribute to parasitic capacitances $C_p$. Since capacitances $C_1$ and $C_2$ contain information about the measuring signal, parasitic capacitances $C_p$ may influence the sensitivity of traditional sensors. In particular, process-induced fluctuations in parasitic capacitances $C_p$ due to bond wire drift, for example, may result in variations in sensitivity, which may subsequently necessitate a separate sensitivity adjustment of the sensor.

BRIEF SUMMARY OF THE INVENTION

An object of the present invention is to provide a sensor, e.g., a micromechanical sensor, for capacitive detection of a mechanical deflection, which includes a substrate and a mass movable in relation to the substrate, e.g., movable in parallel and/or perpendicularly to the substrate, the substrate having a first and a second substrate electrode. According to the present invention, the mass is divided into at least two electrically separate regions, a first electrically separate region of the mass having a first ground electrode and a second electrically separate region of the mass having a second ground electrode, at least one portion of the first ground electrode being situated in a first region between the first and second substrate electrodes and forming a first differential capacitor, and at least one portion of the second ground electrode being situated in a second region between the first and second substrate electrodes and forming a second differential capacitor.

Such a sensor has the advantage that the influence of parasitic capacitances may be reduced or even eliminated. In particular, the two differential capacitors may be evaluated separately from one another, and an output signal, which is mostly independent of the parasitic capacitances, may be obtained.

In particular, the first electrically separate region of the mass may function as part of the first ground electrode, and the second electrically separate region of the mass may function as part of the second ground electrode. For example, the first electrically separate region of the mass may function as a comb spine of a first ground electrode designed in the form of a comb electrode and the second electrically separate region of the mass may function as a comb spine of a second ground electrode designed in the form of a comb electrode. The electrical wiring may be accomplished via a suspension or support of the movable system of the mass, in particular via springs and/or armatures.

Within the scope of an example embodiment of the sensor, the mass is divided into electrically separate regions of different sizes.

Within the scope of another example embodiment of the sensor, the mass is divided into electrically separate regions by an insulation region. In this way the two ground electrodes may be implemented in a simple manner in particular.

Within the scope of another example embodiment of the sensor, the first differential capacitor has a larger capacitor surface area than the second differential capacitor.

Within the scope of another example embodiment of the sensor, the sensor includes a first evaluation device for measuring the capacitances of the first differential capacitor and/or the output voltage across the first differential capacitor, and a second evaluation device for measuring the capacitances of the second differential capacitor and/or the output voltage across the second differential capacitor.

Within the scope of another example embodiment of the sensor, the first evaluation device and the second evaluation device each include an impedance converter, in particular an operational amplifier as an impedance converter, for example, an operational amplifier having a voltage gain of 1 as an impedance converter (English: op-amp-based unity gain buffer amplifier).

Within the scope of another example embodiment of the sensor, the first and second substrate electrodes are designed in the form of comb electrodes having a comb spine and two or more comb teeth, the comb teeth of the first and second substrate electrodes being aligned in parallel and situated in alternation. The first and second ground electrodes are preferably also designed in the form of comb electrodes having a comb spine and two or more comb teeth. The comb prongs of the first ground electrodes are situated in particular in a first region between one comb tooth of the first substrate electrode and one comb tooth of the second substrate electrode. The comb teeth of the second ground electrode are situated in particular in a second region between one comb, tooth of the first substrate electrode and one comb tooth of the second substrate electrode.

The mass may be suspended resiliently in particular. For example, the mass may be movably suspended from armatures using springs. The mass may be suspended from armatures by springs mounted on the two electrically separate regions, the armatures being situated in such a way that they are insulated from one another and from the substrate.

Within the scope of another example embodiment of the sensor, the sensor is a motion sensor, in particular an acceleration sensor and/or resonant frequency sensor and/or yaw rate sensor and/or inertial sensor, pressure sensor, magnetic field sensor, current sensor and/or temperature sensor, for example, a sensor for measuring a mechanical and/or electrostatic and/or thermoelastic and/or magnetic and/or piezoelectric deflection.

Another object of the present invention is a method for capacitive detection of a mechanical deflection, in particular having a sensor according to the present invention, including the method steps:

a) applying a reference voltage to the first and second substrate electrodes, in particular according to a clocking scheme, b) determining the output voltage across the first differential capacitor and the output voltage across the second differential capacitor, in particular separately from one another, and c) ascertaining the deflection of the mass with respect to the substrate and/or the parasitic capacitance from the output voltage across the first differential capacitor and the output voltage across the second differential capacitor.

The output voltage across the first differential capacitor may be determined, for example, by the first evaluation device, and the output voltage across the second differential capacitor may be determined by the second evaluation device.

Assuming that on the basis of the symmetrical wiring, the parasitic capacitances acting on the evaluation devices are almost the same, then actual deflection x of the seismic mass as well as the value of parasitic capacitance $C_p$ may be ascertained from the two output voltages.

Within the scope of an example embodiment of the method, deflection x of the mass with respect to the substrate is ascertained by using equation (1):

$$x = \frac{U_{out,1} U_{out,2} d_C (n_1 - n_2)}{U_{ref}(U_{out,2} n_1 - U_{out,1} n_2)}$$

Where $U_{out,1}$ is the output voltage across the first differential capacitor, $U_{out,2}$ is the output voltage across the second differential capacitor, $d_C$ is the distance between the first and second substrate electrodes and the parts of the first and second ground electrode(s) situated therebetween, in particular in the starting position/middle position/null position and the distance between the comb teeth of the first and second substrate electrodes and the comb teeth of the first and second ground electrode(s) situated therebetween, in particular in the starting position/middle position/null position, $n_1$ is the number of parts of the first ground electrode situated between the first and second substrate electrodes or the number of comb teeth of the first ground electrode, $n_2$ is the number of parts of the second ground electrode situated between the first and second substrate electrodes, or the number of comb teeth of the second ground electrode, and $U_{ref}$ is the reference voltage across the first and second substrate electrodes.

Within the scope of another example embodiment of the method, parasitic capacitance $C_p$ is ascertained by using equation (2):

$$C_p = \frac{(U_{out,2} n_1 - U_{out,1} n_2) U_{ref}^2 \varepsilon_0 h l_C n_1 n_2 (U_{out,2} - U_{out,1})}{d_C((U_{out,1} n_1 U_{out,2} - U_{out,2} n_2 U_{out,1})^2 - (U_{out,1} n_2 U_{ref} - U_{out,2} n_1 U_{ref})^2)}$$

Where $U_{out,1}$ is the output voltage across the first differential capacitor, $U_{out,2}$ is the output voltage across the second differential capacitor, $d_C$ is the distance between the first and second substrate electrodes and the parts of the first and second ground electrode(s) situated therebetween, in particular in the starting position/middle position/null position, or the distance between the comb teeth of the first and second substrate electrodes and the comb teeth of the first and second ground electrode(s) situated therebetween, in particular in the starting position/middle position/null position, $l_C$ is the length of the first and second substrate electrodes, acting as the plate capacitor, and the length of the parts of the first and second ground electrode(s) situated therebetween, also acting as the plate capacitor, or the length of the comb teeth of the first and second substrate electrodes, acting as the plate capacitor, and the length of the comb teeth of the first and/or second ground electrode(s) situated therebetween, also acting as the plate capacitor, h is the height/layer thickness of the first and second substrate electrodes and the parts of the first and second ground electrode(s) situated therebetween, or the height/layer thickness of the comb teeth of the first and second substrate electrodes and the comb teeth of the first and second ground electrode(s) situated therebetween, $n_1$ is the number of parts of the first ground electrode situated between the first and second substrate electrodes, or the number of comb teeth of the first ground electrode, $n_2$ is the number of parts of the second ground electrode situated between the first and second substrate electrodes, or the number of comb teeth of the second ground electrode, and $U_{ref}$ is the reference voltage across the first and second substrate electrodes.

Another object of the present invention is the use of a sensor according to the present invention as a motion sensor, in particular as an acceleration sensor and/or resonant frequency sensor and/or yaw rate sensor, pressure sensor, magnetic field sensor, current sensor and/or temperature sensor, for example, a sensor for measuring a mechanical and/or electrostatic and/or thermoelastic and/or magnetic and/or piezoelectric deflection.

DETAILED DESCRIPTION OF THE INVENTION

Figure 1:
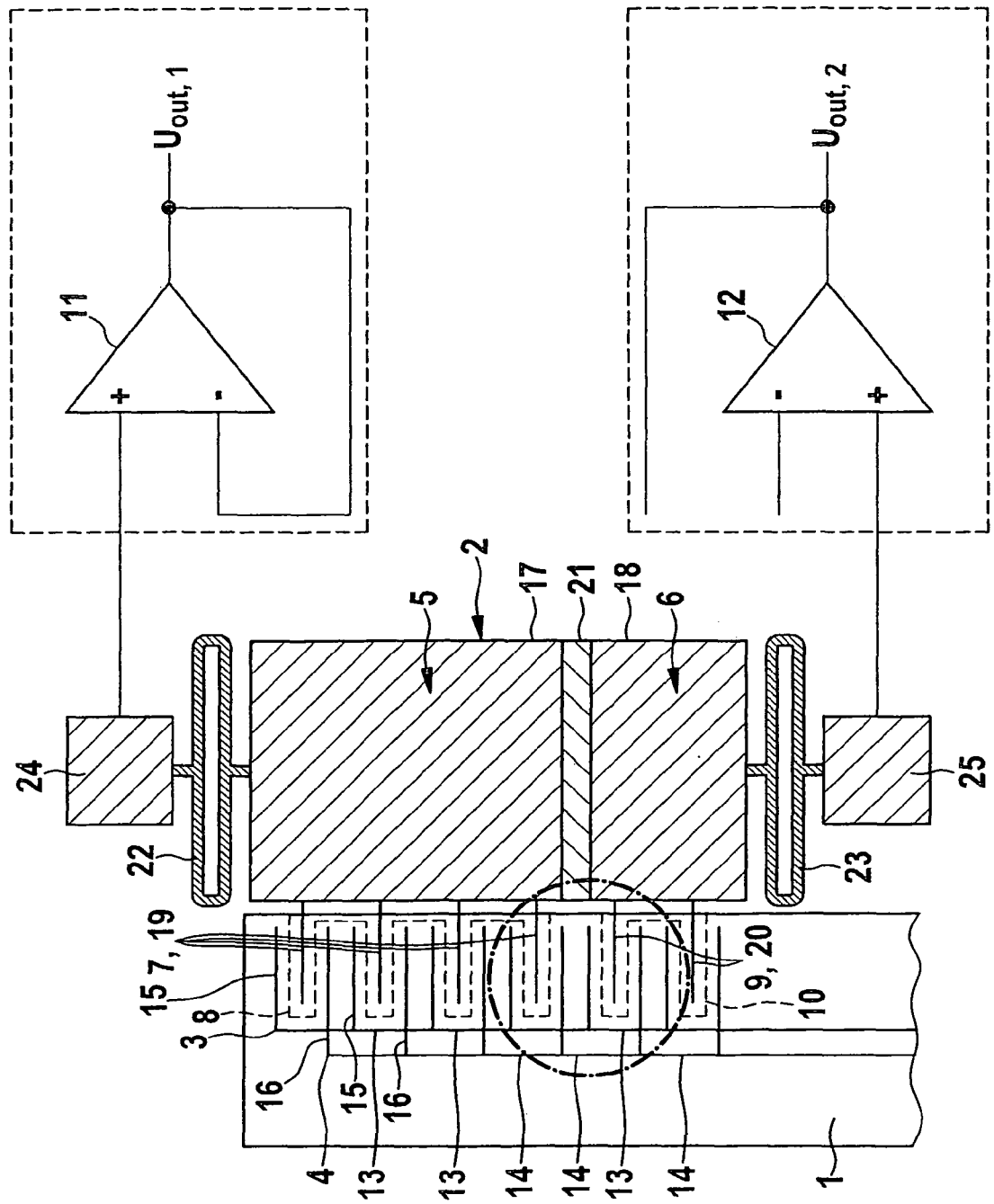
FIG. 1 schematically shows a cross section through an example embodiment of a sensor according to the present invention.

FIG. 1 shows a cross section through an example embodiment of a sensor according to the present invention, designed in the form of an acceleration sensor for capacitively detecting a mechanical deflection. FIG. 1 shows that the sensor includes a substrate 1 and a mass 2, which is movable in parallel and/or perpendicularly to the substrate in particular.

Substrate 1 has a first substrate electrode 3 and a second substrate electrode 4 fixedly anchored on substrate 1. Mass 2 is divided by an insulation region 21 into two regions 17, 18 of different sizes separated electrically, the first electrically separate region 17 of mass 2 having a first ground electrode 5, and the second electrically separate region 18 of mass 2 having a second ground electrode 6. FIG. 1 shows that a portion 7 of first ground electrode 5 is situated in first region 8 between first substrate electrode 3 and second substrate electrode 4 and forms a first differential capacitor 3, 7, 4, a portion 9 of second ground electrode 6 being situated in a second region 10 between first substrate electrode 3 and second substrate electrode 4 and forming a second differential capacitor 3, 9, 4. Portions 15, 16, 7/19, 9/20 of substrate electrodes 3, 4 and ground electrodes 5, 6 forming differential capacitors 3, 7/19, 4; 3, 9/20, 4 are situated in one plane and have the same material thickness/layer thickness in particular. First differential capacitor 3, 7, 4 has a larger capacitor surface area in FIG. 1 than second differential capacitor 3, 9, 4. FIG. 1 also shows that the sensor has a first evaluation device 11, which includes an operational amplifier as an impedance converter, for measuring output voltage $U_{out,1}$ across first differential capacitor 3, 7, 4 and a second evaluation device 12, which includes an operational amplifier as an impedance converter, for measuring output voltage $U_{out,2}$ across second differential capacitor 3, 9, 4.

FIG. 1 shows in particular that first substrate electrode 3 and second substrate electrode 4 and first ground electrode 5 and second ground electrode 6 are designed in the form of comb electrodes having a comb spine 13, 14, 17, 18 and two or more comb teeth 15, 16, 19, 20. Comb teeth 15, 16 of first substrate electrode 3 and second substrate electrode 4 are aligned in parallel and situated in alternation. Comb teeth 19 of first ground electrode 5 are situated in a first region 8 between a comb tooth 15 of first substrate electrode 3 and a comb tooth 16 of second substrate electrode 4. By analogy with that, comb teeth 20 of second ground electrode 6 are situated in a second region 10 between a comb tooth 15 of first substrate electrode 3 and a comb tooth 16 of second substrate electrode 4. In particular the first electrically separate region 17 of mass 2 may function as a part, in particular the comb spine, of first ground electrode 5, and the second electrically separate region 18 of mass 2 may function as a part, in particular the comb spine, of second ground electrode 6. Elongated electrodes (electrode fingers) 7, 19; 9, 20, which function as comb teeth and move together with mass 2, are attached to the two electrically separate regions 17, 18 of the mass. FIG. 1 also shows that two electrically separate regions 17, 18 are suspended on armatures 24, 25 by springs 22, 23 and are electrically connected to one another—while each is separated from the others—on one of evaluation devices 11, 12, evaluation devices 11, 12 each being designed as a buffer, supplying voltages $U_{out,1}$ and $U_{out,2}$ at the outputs.

Figure 2:
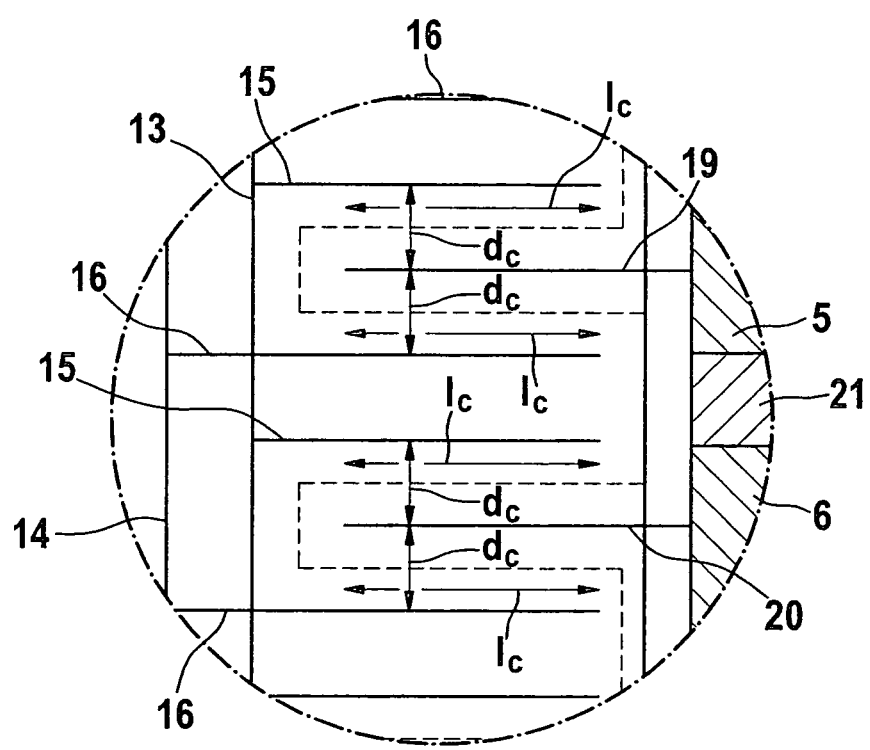
FIG. 2 shows an enlarged detail from FIG. 1.

FIG. 2 illustrates distance $d_C$ between first substrate electrode 3 and second substrate electrode 4 and parts 19, 20 of first ground electrode 5 and second ground electrode 6 situated therebetween. FIG. 2 in particular shows that distance $d_C$ between comb teeth 15, 16 of first substrate electrode 3 and second substrate electrode 4 and comb teeth 19, 20 of first ground electrode 5 and second ground electrode 6 situated therebetween are the same size in the starting position/middle position/null position or the undeflected position. In addition, FIG. 2 illustrates effective length $l_C$ of first substrate electrode 3 and second substrate electrode 4, acting as the plate capacitor, and the effective length of parts 19, 20 of the first ground electrode 5 and the second ground electrode 6 situated therebetween, also acting as the plate capacitor. FIG. 2 shows in particular that length $l_C$ between comb teeth 15, 16 of first substrate electrode 3 and second substrate electrode 4, which is acting as the plate capacitor, and comb teeth 19 of the first ground electrode 5 situated therebetween is the same size as length $l_C$ between comb teeth 15, 16 of first substrate electrode 3 and second substrate electrode 4 and comb teeth 20 of second ground electrode 6, which is situated therebetween, also acting as the plate capacitor.

What is claimed is:

1. A sensor for capacitive detection of a mechanical deflection, comprising:
    a substrate having a first substrate electrode and a second substrate electrode; and
    a mass movable relative to the substrate, wherein the mass is divided into (i) a first electrically separate region having a first ground electrode and (ii) a second electrically separate region having a second ground electrode, at least one portion of the first ground electrode being situated in a first region between the first substrate electrode and the second substrate electrode and forming a first differential capacitor, and at least one portion of the second ground electrode being situated in a second region between the first substrate electrode and the second substrate electrode and forming a second differential capacitor.

2. The sensor as recited in claim 1, wherein the first and second electrically separate regions have different sizes.

3. The sensor as recited in claim 1, wherein an insulation region divides the first and second electrically separate regions.

4. The sensor as recited in claim 1, wherein the first differential capacitor has a larger capacitor surface area than the second differential capacitor.

5. The sensor as recited in claim 1, further comprising:
    a first evaluation device configured to measure at least one of a capacitance of the first differential capacitor and an output voltage across the first differential capacitor; and
    a second evaluation device configured to measure at least one of a capacitance of the second differential capacitor and an output voltage across the second differential capacitor.

6. The sensor as recited in claim 5, wherein the first and second evaluation devices each include an operational amplifier as an impedance converter.

7. The sensor as recited in claim 1, wherein:
    the first substrate electrode, the second substrate electrode, the first ground electrode, and the second ground electrode are each embodied as a comb electrode having a comb spine and at least two comb teeth;
    the comb teeth of the first substrate electrode and the second substrate electrode are aligned in parallel and situated in alternation;
    the comb teeth of the first ground electrode are situated in the first region between a comb tooth of the first substrate electrode and a comb tooth of the second substrate electrode; and
    the comb teeth of the second ground electrode are situated in the second region between a comb tooth of the first substrate electrode and a comb tooth of the second substrate electrode.

8. The sensor as recited in claim 7, wherein the sensor is at least one of a motion sensor, a pressure sensor, a magnetic field sensor, a current sensor and a temperature sensor.

* * * * *